United States Patent [19]

Sugayama et al.

[11] Patent Number: 4,728,825
[45] Date of Patent: Mar. 1, 1988

[54] BIDIRECTIONAL MOS LINEAR SWITCH

[75] Inventors: Shigeru Sugayama, Hitachi; Tadaaki Kariya, Ibaraki; Tatsuo Shimura; Sigeo Tomita, both of Hitachi, all of Japan

[73] Assignees: Haramachi Semi-Hitachi Ltd., Japan; Hitachi Conductor Ltd.

[21] Appl. No.: 868,022

[22] Filed: May 29, 1986

[30] Foreign Application Priority Data

May 31, 1985 [JP] Japan .................................. 60-116449

[51] Int. Cl.⁴ .......................................... H03K 17/687
[52] U.S. Cl. .................................... 307/570; 307/577
[58] Field of Search ............... 307/246, 570, 584, 575, 307/577

[56] References Cited

U.S. PATENT DOCUMENTS 4,438,356 3/1984 Fleischer ..................... 307/571
4,564,770 1/1986 Sherman et al. ............. 307/570

*Primary Examiner*—Stanley D. Miller
*Assistant Examiner*—B. P. Davis
*Attorney, Agent, or Firm*—Antonelli, Terry & Wands

[57] ABSTRACT

In a bidirectional linear switch in which two MOS transistors are used with their sources mutually connected, the gates and the substrates of the transistors are also respectively mutually connected and a control signal is applied to the gates. A potential of the polarity such that the substrates are reversely biased to the sources is applied between the substrates and the sources. With this constitution, the linearity of the bidirectional switch is improved.

6 Claims, 9 Drawing Figures

4,728,825

BIDIRECTIONAL MOS LINEAR SWITCH

BACKGROUND OF THE INVENTION

The present invention relates to a bidirectional linear switch and, more particularly, to a bidirectional linear MOS transistor switch suitable as a switch for use in an electronic exchange system.

A telephone exchange supplies a predetermined AC signal to a telephone line to be examined and measures an impedance of the load (telephone) when, for example, it is desired to measure the speech rate or to know the number of telephone sets installed. For a switch to control the supply of the AC signal, it is necessary that the linearity to the input AC signal of the characteristic of the switch in the conducting state (hereinafter, this linearity is referred to as a linearity of the ON characteristic) is good. In other words, it is required as the characteristic of the switch to have a predetermined constant impedance to the AC signal. As an example of such switches AC signals which are used in the conventional electronic exchanges, for example, there has been known a bidirectional switch which is constituted by two n channel type MOS transistors (hereinafter, referred to as nMOS) as disclosed in U.S. Pat. No. 4,170,740. In this switch, the substrate and source are short-circuited, respectively. However, the nMOS arranged in the direction opposite to the current flowing through the switch represents the parasitic diode characteristic due to the short-circuit between the substrate and the source, so that there is a problem that the linearity of the ON characteristic is lost.

SUMMARY OF THE INVENTION

It is an object of the present invention to, in a bidirectional linear MOS transistor switch, provide a bidirectional linear switch in which the linearity of the ON characteristic can be secured under a wide operating voltage range with respect to both polarities or both current directions.

In the bidirectional linear switch using two nMOS's, a current flows necessarily in the direction opposite to that of one MOS transistor. The present inventors have confirmed by the experiments that, at this time, the parasitic diode existing in the direction opposite to that of the one MOS transistor is made conductive and the voltage between the source and drain of the MOS transistor when the parasitic diode is made conductive depends on the potential of the substrate with respect to the source. According to one aspect of the invention based on the above fact, in a bidirectional linear switch in which two n-channel type MOS transistors are used and their sources are connected with each other, the gates and substrates of the respective transistors are respectively connected, a control signal is supplied to the gates, a potential such that the sources become positive is applied to the substrates so that the substrates are reversely biased to the sources.

DESCRIPTION OF THE PREFERRED EMBODIMENTS

An embodiment of the present invention will be described hereinbelow with reference to FIGS. 1 to 4.

Figure 1:
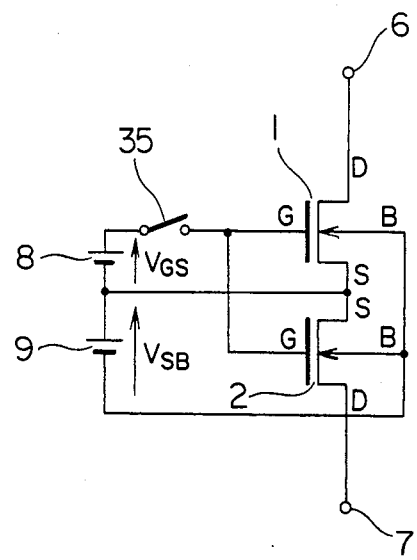
FIG. 1 is a circuit diagram showing an embodiment of the present invention.

In FIG. 1, sources S, gates G, and substrates B of an nMOS 1 and an nMOS 2 are connected, respectively. A DC voltage source 9 for reverse-biasing the substrates is connected between the sources S and the substrates B. A DC voltage source 8 to generate a control signal is connected between the gates G and the sources S through a switch 35. Drains D of the nMOS's 1 and 2 are connected to switch terminals 6 and 7, respectively. When the switch 35 is closed, a voltage $V_{GS}$ of the DC voltage source 8 is applied between the gates G and the sources S of the nMOS's 1 and 2 in the polarity wherein the gates G are positive, respectively. A voltage $V_{SB}$ of the DC voltage source 9 is applied between the sources S and the substrates B of the nMOS's 1 and 2 in the polarity wherein the sources S are positive, respectively.

When the gates G are biased to the positive voltage in response to a control signal applied to the gates G by closing the switch 35, the nMOS's 1 and 2 are turned on. Further, when a voltage such that the terminal 6 is the positive side is applied between the terminals 6 and 7, a current $i_D$ flows in the direction from the terminal 6 to the terminal 7.

Figure 2:
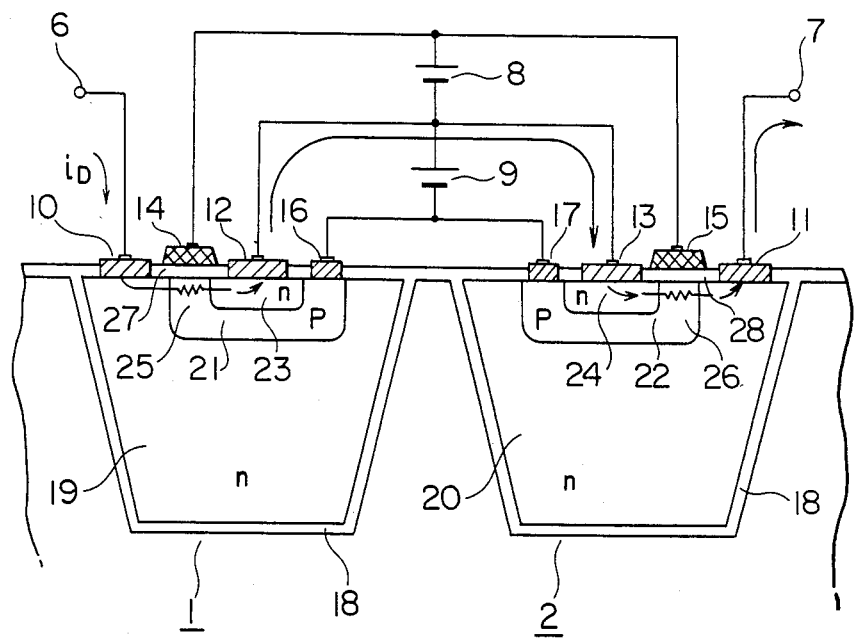
FIG. 2 is a cross-sectional view of a device when the circuit of FIG. 1 is shown as a device structure.

The operation of the embodiment will now be described with reference to FIG. 2. FIG. 2 shows a device structure in the case where the constitution of FIG. 1 is fabricated on a silicon chip having a dielectric isolation configuration. The nMOS 1 using a p-type semiconductor 21 as a substrate B and the nMOS 2 using a p-type semiconductor 22 as a substrate B are connected similarly to FIG. 1 and the switch 35 is closed. (The switch 35 is not shown since it is closed in this case.)

The nMOS's 1 and 2 are insulated by insulation oxide films 18, respectively. Drain electrodes 10 and 11 are connected to n-type semiconductors 19 and 20 which form the drains of the nMOS's 1 and 2, respectively. Base electrodes 16 and 17 are connected to the p-type semiconductors 21 and 22 which form the substrates B, respectively. Source electrodes 12 and 13 are connected to n-type semiconductors 23 and 24 which form the sources, respectively. Gate electrodes 14 and 15 are arranged through oxide films 27 and 28, respectively. Arrows shown in FIG. 2 indicate the path of the current $i_D$ flowing in the direction from the terminal 6 to the terminal 7. Equivalent resistors 25 and 26 equivalently represent ON resistors in the channels of the nMOS's 1 and 2, respectively.

Assuming that the current $i_D$ is now flowing in the direction indicated by the arrows, the current $i_D$ is the forward current for the nMOS 1 and is the reverse current for the nMOS 2. Although the nMOS 2 shows the characteristic similar to the forward current for the reverse current as well, when the parasitic diode which is formed by the p-type semiconductor 22 and n-type semiconductor 20 of the nMOS 2 is turned on, the nMOS 2 represents the diode characteristic.

When the voltage of the voltage source 9 is zero, denoting that the equivalent resistances 25 and 26 are $R_{ON1}$ and $R_{ON2}$ and a forward drop voltage or built-in voltage of the parasitic diode is $V_F$, if $$i_D \times R_{ON2} > V_F \quad (1)$$

is satisfied, the parasitic diode is turned on and the nMOS 2 represents the forward characteristic of the parasitic diode. However, when the voltage of the voltage source 9 has the value of $V_{SB}$, the junction which is formed by the p-type semiconductor 22 and n-type semiconductor 24 is reversely biased due to the voltage $V_{SB}$ and the depletion layer is formed. Thus, the condition to turn on the parasitic diode of the nMOS 2 becomes the following equation (2) instead of equation (1).

$$i_D \times R_{ON2} > V_F + V_{SB} \quad (2)$$

Equation (2) indicates that the parasitic diode in the nMOS 2 is turned on when the voltage drop $i_D \times R_{ON2}$ of the nMOS 2 reaches the sum of the built-in voltage $V_F$ of the parasitic diode and the substrate's reverse bias voltage $V_{SB}$ or higher.

Therefore, when the voltage between the terminals 6 and 7 at which the conduction of the parasitic diode starts is defined as $V_m$, $V_m$ is represented by the following equations (3) and (4).

$$V_m = R_{ON1} \times i_D + R_{ON2} \times i_D \quad (3)$$

$$V_m = R_{ON1} \times i_D + V_F + V_{SB} \quad (4)$$

The ON characteristic of the bidirectional nMOS switch in the embodiment will be described with reference to FIG. 3. Here, it is assumed that the ON resistances $R_{ON1}$ and $R_{ON2}$ of the above-mentioned nMOS's are equal to one another and are $R_{ON}$. Accordingly, the first and second terms of equation (4) have the following relationship.

$$R_{ON} \times i_D + V_F + V_{SB} \quad (5)$$

Accordingly, $V_m$ is determined by the following equation (6).

$$V_m = 2X (V_F + V_{SB}) \quad (6)$$

Figure 3:
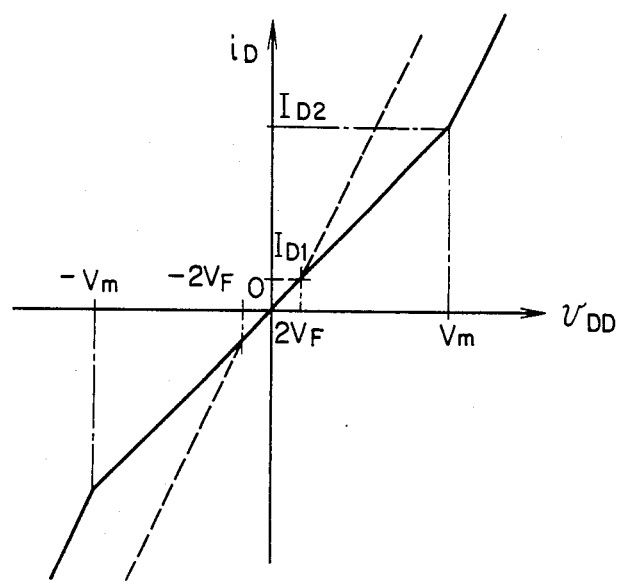
FIG. 3 is a diagram showing a characteristic of the circuit of FIG. 1.

In FIG. 3, abscissa denotes an applied voltage $V_{DD}$ between the terminals 6 and 7 in which the terminal 6 is the positive side, and ordinate represents the current $i_D$ flowing in the direction from the terminal 6 to the terminal 7. A broken line indicates the characteristic of the conventional example in which the substrates B and sources S are short-circuited. It will be understood from this graph that the ON resistance of the bidirectional nMOS switch suddenly changes at the point of the value which is twice the built-in voltage $V_F$ and current value $I_{D1}$ of the parasitic diode in the case of the conventional example.

However, in the case of the embodiment, as shown by a solid line, the position at which the change in the ON resistance starts is enlarged to the position of the applied voltage $V_m$ and current $I_{D2}$ which are obtained from equation (6) as compared with the position of $2V_F$ and $I_{D1}$. Thus, the linear characteristic of the bidirectional nMOS switch is secured within a wide range with respect to both of the applied voltage $V_{DD}$ and current $i_D$.

Figure 4:
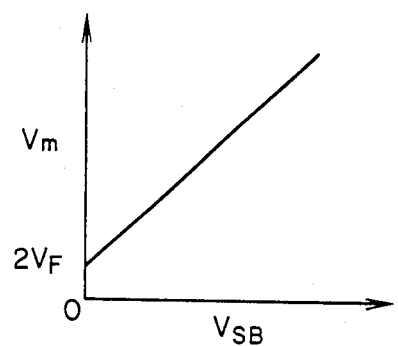
FIG. 4 is a diagram showing another characteristic of the embodiment of FIG. 1.

The voltage $V_m$ indicative of the range of the linear characteristic depends on the substrate's reverse bias voltage $V_{SB}$ as shown in FIG. 4. With an increase in $V_{SB}$, the linearity of the bidirectional nMOS switch is secured at the applied voltage $V_{DD}$ of a wide range.

Another embodiment according to the invention will now be described with reference to FIG. 5. In the diagram, the parts and elements similar to those in FIG. 1 are designated by the same reference numerals and their descriptions are omitted.

In the embodiment of FIG. 1, the control signal was generated and the reverse bias voltage of the base was formed using the DC voltage sources 8 and 9, respectively. However, in the embodiment of FIG. 5, they are produced using one DC voltage source and a circuit to divide the voltage of this voltage source.

More specifically, a DC voltage source 5 is connected to the gates G and substrates B through the switch 35. A resistor 3 is connected between the gates G and the sources S and a resistor 4 is connected between the sources S and the substrates B, thereby constituting a circuit to divide the voltage of the voltage source 5.

When the switch 35 is closed, the voltage of the DC voltage source 5 is divided by the resistors 3 and 4 and the divided voltage, namely, the voltage $V_{GS}$ across the resistor 3 is applied between the gates G and the sources S of the nMOS's 1 and 2 in the polarity wherein the gates G are positive, respectively, therby turning on the bidirectional switch. The voltage $V_{SB}$ across the resistor 4 is applied between the sources S and the substrates B of the nMOS's 1 and 2 in the polarity wherein the sources S are positive, respectively, thereby reversely biasing the substrates B to the respective sources S. The subsequent operations are similar to those in the embodiment of FIG. 1; therefore, their descriptions are omitted.

According to the embodiment, the control signal or gate bias voltage and substrate's reverse bias voltage can be derived by one voltage source. Thus, there is an effect that the circuit can be simplified.

Figure 5:
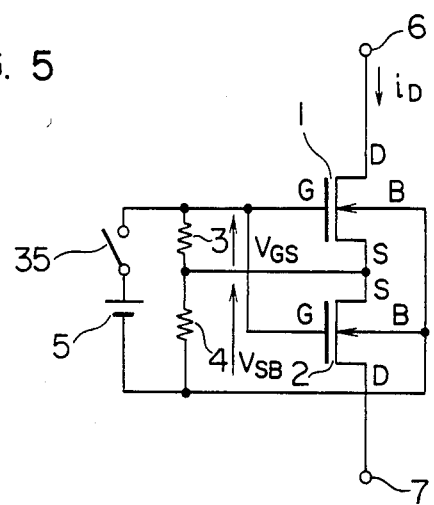
FIGS. 5 to 9 are circuit diagrams for explaining other embodiments, respectively.
Figure 6:
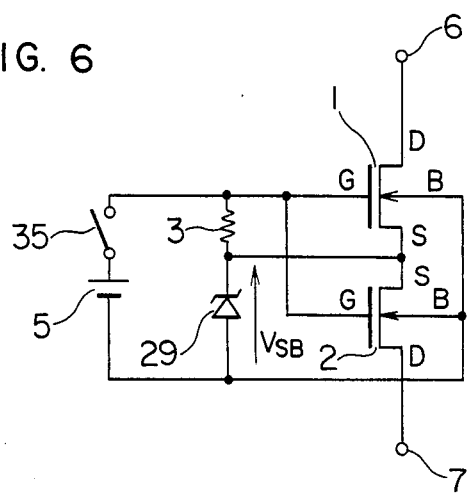

FIG. 6 shows still another embodiment of the invention, which differs from the embodiment of FIG. 5 with regard to the point such that the substrate's reverse bias voltage source in the voltage dividing circuit consists of a Zener diode 29.

According to the embodiment, since the substrate's reverse bias voltage value $V_{SB}$ can be set to be constant irrespective of the voltage of the voltage source 5 and the value of the resistor 3, there is an advantageous effect that the more stable circuit operation can be obtained.

Figure 7:
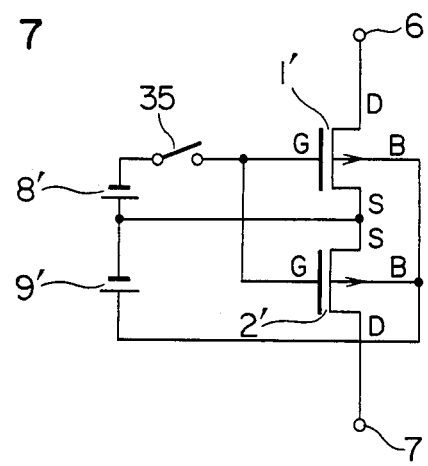

FIG. 7 shows still another embodiment according to the invention. According to this embodiment, a bidirectional linear switch is constituted using pMOS's 1' and 2' in place of the nMOS's 1 and 2 in FIG. 1. Further, in place of the DC voltage source 8 in FIG. 1, a voltage source 8' for generating a control signal is applied between the gates G and the sources S through the switch 35 in the polarity wherein the gates G are negative. In addition, in place of the DC voltage source 9, a DC voltage source 9' for the substrate's reverse bias is applied between the sources S and the substrates B in the polarity wherein the sources S are negative. The other constitution is similar to that in FIG. 1.

Figure 8:
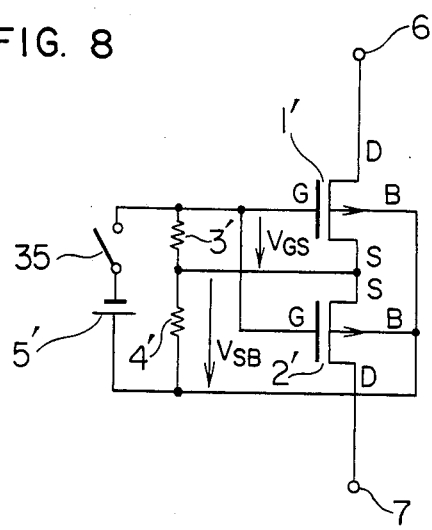

FIG. 8 shows still another embodiment of the invention. Similar to the case of the embodiment of FIG. 5, only one DC voltage source and a circuit to divide the voltage of this DC voltage source are provided in place of two DC voltage sources 8' and 9' in the embodiment of FIG. 7.

More specifically, in FIG. 8, a DC voltage source 5' is connected between the gates G and the substrates B through the switch 35. A resistor 3+ is connected between the gates G and the sources S and a resistor 4' is connected between the sources S and the substrates B, respectively, thereby constituting the circuit to divide the voltage of the voltage source 5'.

When the switch 35 is closed, the voltage of the DC voltage source 5' is divided by the resistors 3' and 4' and the divided voltage, namely, the voltage $V_{GS}$ across the resistor 3' is applied between the gates G and the sources S of the pMOS's 1' and 2' in the polarity wherein the gates G are negative, respectively, thereby turning on the bidirectional switch. The voltage $V_{SB}$ across the resistor 4' is applied between the sources S and the substrates B of the pMOS's 1' and 2' in the polarity wherein the sources S are negative, respectively, thereby reversely biasing the substrates B to the respective sources S. The subsequent constitution and operations are similar to those in the embodiment of FIG. 7; therefore, their descriptions are omitted.

According to this embodiment, similar to the case of FIG. 5, the control signal or the gate bias voltage and substrate's reverse bias voltage can be derived from one voltage source, so that there is an advantageous effect that the circuit can be simplified.

Figure 9:
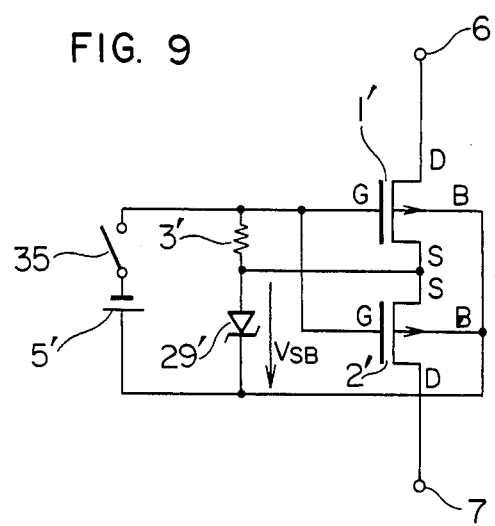

FIG. 9 shows still another embodiment of the invention. Similar to the case of the embodiment of FIG. 6, a Zener diode 29' is used in place of the resistor 4' of the voltage dividing circuit in FIG. 8 and the voltage $V_{SB}$ across this Zener diode is used as a substrate's reverse bias voltage source.

According to this embodiment, similar to the case of the embodiment of FIG. 6, the substrate's reverse bias voltage $V_{SB}$ can be set to be constant irrespective of the voltage of the voltage source 5' and the value of the resistor 3'. Therefore, there is an advantageous effect that the more stable circuit operation can be derived.

According to the present invention, the substrates can be easily reversely biased, so that there is an effect that the ON characteristic at the applied voltage between the drains in a wide range can be made linear.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

Further, use of the bidirectional switch of the invention is not limited to the telephone exchange system but can be obviously applied to various kinds of fields.

We claim:

1. A bidirectional linear switch comprising:
   first and scond switch terminals; and
   two MOS transistors whose sources, gates, and substrates are respectiveley mutually and electrically connected together at predetermined points and whose drains are respectively connected to said first and second switch terminals, wherein a reverse bias voltage s applied between a connecting point of said sourcesand a connecting point of said substrates such that said substrates are reversely biased relative to said sources, and wherein a control signal for controlling said linear switch isapplied between a connecting point of said gates and the connecting point of said sources.

2. A bidirectional linear switch according to claim 1, wherein said control signal is applied between the connecting point of said gates and the connecting point of said substrates, and wherein said bidirectional linear switch further includes voltage dividing means for generating a divided voltage of said control signal, said divided voltage being applied as said reverse bias voltage to the connecting point of said sources.

3. A bidirectional linear switch according to claim 2, wherein said voltage dividing means includes a series connection of two resistors connected between the connecting point of said gates and the connecting point of said substrates.

4. A bidirectional linear switch according to claim 2, wherein said voltage dividing means includes a series connection of a resistor and a Zener diode which are electrically connected between the connecting point of said gates and the connecting point of said substrates.

5. A bidirectional linear switch according to claim 1, wherein said two MOS transistors include n-channel type MOS transistors.

6. A bidirectional linear switch according to claim 1, wherein said two MOS transistors include p-channel type MOS transistors.

* * * * *

UNITED STATES PATENT AND TRADEMARK OFFICE
CERTIFICATE OF CORRECTION

PATENT NO. : 4,728,825
DATED : March 1, 1988
INVENTOR(S) : S. Sugayama et al

It is certified that error appears in the above-identified patent and that said Letters Patent is hereby corrected as shown below:

On the Title Page, left-hand column,

"[73] Assignees:  Haramachi Semi-Hitachi, Ltd., Japan; Hitachi Conductor Ltd."

should read:

--[73] Assignees:  Hitachi, Ltd.; Hitachi Haramachi Semi-Conductor Ltd., both of Japan--

Signed and Sealed this

Thirty-first Day of October, 1989

Attest:

DONALD J. QUIGG

Attesting Officer

Commissioner of Patents and Trademarks